United States Patent
Yamaguchi et al.

(10) Patent No.: US 7,521,629 B2
(45) Date of Patent: Apr. 21, 2009

(54) THERMOELECTRIC TRANSPORTATION MATERIAL CONTAINING NITROGEN

(75) Inventors: Shigeo Yamaguchi, Ibaraki (JP); Yasuo Iwamura, Ibaraki (JP); Atsushi Yamamoto, Ibaraki (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 0 days.

(21) Appl. No.: 10/522,573

(22) PCT Filed: Jul. 25, 2003

(86) PCT No.: PCT/JP03/09491

§ 371 (c)(1),
(2), (4) Date: Jan. 28, 2005

(87) PCT Pub. No.: WO2004/012276

PCT Pub. Date: Feb. 5, 2004

(65) Prior Publication Data

US 2006/0037637 A1 Feb. 23, 2006

(30) Foreign Application Priority Data

Jul. 29, 2002 (JP) .............................. 2002-219288
Aug. 18, 2002 (JP) .............................. 2002-272054

(51) Int. Cl.
*H01L 35/12* (2006.01)
*C01G 15/00* (2006.01)

(52) U.S. Cl. .................. 136/236.1; 136/238; 423/593.1

(58) Field of Classification Search ............... 136/236.1, 136/238, 239; 423/592.1, 593.1, 385, 351, 423/406, 400; 257/467
See application file for complete search history.

(56) References Cited

U.S. PATENT DOCUMENTS 4,365,107 A * 12/1982 Yamauchi .................... 136/258

(Continued)

FOREIGN PATENT DOCUMENTS

DE  696 21 374 T2   9/2002

(Continued)

OTHER PUBLICATIONS

O'Leary et al, "Electron transport in wurtzite indium nitride," J. Appl. Phys., 83(2), pp. 826-829, Jan. 15, 1998.*

(Continued)

*Primary Examiner*—Nam X Nguyen
*Assistant Examiner*—Jeffrey T Barton
(74) *Attorney, Agent, or Firm*—Morgan, Lewis & Bockius LLP

(57) ABSTRACT

A nitrogen-containing thermoelectric material, which has an element composition represented by:

$$Al_zGa_yIn_xM_uR_vO_sN_t \quad (A)$$

or $$Al_zGa_yIn_xM_uR_vD_wN_m \quad (B)$$

(wherein M represents a transition element; R represents a rare earth element; D represents at least one element selected from elements of the Group IV or II; $0 \leq z \leq 0.7$, $0 \leq y \leq 0.7$, $0.2 \leq x \leq 1.0$, $0 \leq u \leq 0.7$, $0 \leq v \leq 0.05$, $0.9 \leq s+t \leq 1.7$, $0.4 \leq s \leq 1.2$, $0 \leq w \leq 0.2$, and $0.9 \leq m \leq 1.1$; and x+y+z=1), and has an absolute value of a Seebeck coefficient of 40 μV/K or more at a temperature of 100° C. or more. These thermoelectric materials comprise elements having low toxicity, are excellent in a heat resistance, a chemical resistance and the like, and have a high thermoelectric transforming efficiency.

6 Claims, 8 Drawing Sheets

U.S. PATENT DOCUMENTS

| | | | |
|---|---|---|---|
| 5,911,899 | A | 6/1999 | Yoshikai et al. |
| 6,599,564 | B1 * | 7/2003 | Hsieh et al. ............... 427/126.1 |
| 2001/0002048 | A1 * | 5/2001 | Koike et al. .................... 257/80 |
| 2004/0108803 | A1 * | 6/2004 | Scholl et al. ................ 313/491 |

FOREIGN PATENT DOCUMENTS

| | | |
|---|---|---|
| JP | 2001-085751 A | 3/2001 |
| JP | 2001-127350 A | 5/2001 |
| JP | 2001-1223395 | 8/2001 |
| JP | 2002-134798 A | 5/2002 |

OTHER PUBLICATIONS

Steffes et al, "New InxOyNz films for the application of NO2 sensors," Sensors and Actuators B, vol. 77, (2001), pp. 352-358.*

Yamaguchi et al, "Thermoelectric properties of Al1-xInxN and Al1-y-zGayInzN prepared by radio-frequency sputtering: toward a thermoelectric power device," Applied Physics Letters, 82(13), pp. 2065-2067, Mar. 31, 2003.*

Yamaguchi et al, "Thermal diffusivity and thermoelectric figure of merit of Al10xInxN prepared by reactive radio-frequency sputtering," Applied Physics Letters, 83(26), pp. 5398-5400, Dec. 29, 2003.*

Yamaguchi et al, "Thermoelectric devices using InN and Al1-xInxN thin films prepared by reactive radio-frequency sputtering," 84(26), pp. 5344-5346, Jun. 28, 2004.*

* cited by examiner

EDX SPECTRUM OF OXINITRIDE MATERIAL $Al_{0.23}In_{0.70}Ga_{0.07}O_{0.40}N_{0.60}$ $Al_{0.23}In_{0.70}Ga_{0.07}O_{0.40}N_{0.60}$

COMPOSITION ANALYSIS PATTERN OF AlInN BY EDX

COMPOSITION ANALYSIS PATTERN OF GaAlInN BY EDX

THERMOELECTRIC TRANSPORTATION MATERIAL CONTAINING NITROGEN

TECHNICAL FIELD

The present invention relates to an oxynitride thermoelectric material or a nitride thermoelectric material, having a high Seebeck coefficient and a low electrical resistivity.

BACKGROUND ART

At present, most of thermal energy generated in dust combustion in garbage processing factories, nuclear power generation, automotive engines and the like is discarded into the air without being transformed into another energy. Thermoelectric power generation for converting such thermal energy, wasted in the air, directly into electrical energy is extremely effective means for improving the energy efficiency. The thermoelectric conversion method utilizes a Seebeck effect. The method has advantages of not requiring a space-consuming power generating facility, and not involving a gas discharge, and is also advantageous in costs since it can be operated semi-perpetually without any particular maintenance, so long as a temperature difference exists.

Thus the thermoelectric conversion is expected as a technology which will play a role in the resolution of energy problem, but its commercialization requires a thermoelectric material of a high thermoelectric conversion efficiency.

A performance of the thermoelectric material is defined by a figure of merit thermoelectric figure of merit defined by the following equation (1) or by a power factor defined by the following equation (2):

figure of merit=[Seebeck coefficient $(V/K)]^2$/([resistivity $(\Omega m)$]·[thermal conductivity$(W/mK)$])     Equation (1)

Power factor=[Seebeck coefficient $(V/K)]^2$/[resistivity $(\Omega m)$]     Equation (2)

In general, in thermoelectric materials, the higher the figure of merit is, the higher the thermoelectric conversion efficiency is. The figure of merit has an absolute value of about $10^{-6}/K$ in ordinary metals and about $10^{-5}/K$ in semiconductors, and assumes an order of $10^{-4}$ to $10^{-3}/K$ in optimized thermoelectric materials. Similarly, an application to power generation becomes possible with a power factor in the order of $10^{-5}$ to $10^{-3}$ $W/mK^2$. Also, there is required a thermoelectric material excellent in heat resistance and chemical resistance in order to utilize heat of a high temperature.

Currently, $Bi_2Te_3$ or PbTe is utilized as the thermoelectric material, but these materials only have a thermoelectric conversion efficiency as low as about 5%, and the temperature of use is about 200° C. for the former and about 400° C. for the latter, thus involving a limitation that they are not usable to a heat source of a high temperature. Also, because of a deterioration of the characteristics by oxidation in the air, a measure of sealing with an inert gas is required. Also, in both materials, the presence of a toxic element burdensome to the environment constitutes a serious hurdle to the expansion of application. Therefore, there is desired a development of a thermoelectric material capable of resolving these drawbacks.

The present invention has been made in consideration of the above situation of the prior technology. That is, an object of the present invention is to provide a thermoelectric material which comprises elements having low toxicity, is excellent in a heat resistance, a chemical resistance and the like and has a high thermoelectric transforming efficiency.

DISCLOSURE OF THE INVENTION

The present inventors, as a result of various investigations for solving the above drawbacks of the prior thermoelectric materials, have found that an oxynitride thermoelectric material of a specified composition comprising, as a constituent element, an element selected from a transition element, a rare earth element, Al, Ga, In, N and O or a nitride thermoelectric material of a specified composition including, as a constituent element, an element selected from a transition element, a rare earth element, Al, Ga, In and N has a high Seebeck coefficient and a low electric resistivity, thus being useful as a thermoelectric element, and has made the present invention based on such findings.

More specifically, a first nitrogen-containing thermoelectric material of the present invention is an oxynitride thermoelectric material which has an element composition represented by:

Formula: $Al_zGa_yIn_xM_uR_vO_sN_t$     (A)

(wherein M represents a transition element; R represents a rare earth element; $0 \leq z \leq 0.7$, $0 \leq y \leq 0.7$, $0.2 \leq x \leq 1.0$, $0 \leq u \leq 0.7$, $0 \leq v \leq 0.05$, $0.9 \leq s+t \leq 1.7$, and $0.4 \leq s \leq 1.2$; and $x+y+z=1$), and has an absolute value of a Seebeck coefficient of 40 μV/K or more at a temperature of 100° C. or more. The oxynitride thermoelectric material preferably has an electrical resistivity of $10^{-3}$ $\Omega m$ or less.

In the oxynitride thermoelectric material of the present invention, in formula (A), the transition element M is preferably at least one selected from Ni, Fe, Co and Mn, and the rare earth element R is preferably at least one selected from Gd, Sc, Sm, Tb and Dy. Also, the nitride thermoelectric material of the present invention preferably comprises at least one composition which is represented by the above formula and has an amorphous structure.

Also, a second nitrogen-containing thermoelectric material of the present invention has an element composition represented by:

Formula: $Al_zGa_yIn_xM_uR_vD_wN_m$     (B)

(wherein M represents a transition element; R represents a rare earth element; D represents at least one element selected from elements of the Group IV or II; $0 \leq z \leq 0.7$, $0 \leq y \leq 0.7$, $0.2 \leq x \leq 1.0$, $0 \leq u \leq 0.7$, $0 \leq v \leq 0.05$, $0 \leq w \leq 0.2$, and $0.9 \leq m \leq 1.1$; and $x+y+z=1$), and has an absolute value of a Seebeck coefficient of 50 μV/K or more (or −50 μV/K or less) at a temperature of 100° C. or more, and an electrical resistivity of $10^{-3}$ $\Omega m$ or less.

The nitride thermoelectric material is preferably one wherein, in formula (B), M is at least one element selected from Ni, Fe, Co and Mn; R is at least one element selected from Gd, Sc, Sm and Tb; or D is at least one element selected from Ge, Si, Mg and Zn.

Furthermore, the nitride thermoelectric material preferably has an element composition represented by formula (B) and has a wurtzite crystal structure or an amorphous structure.

BEST MODE FOR CARRYING OUT THE INVENTION

In the present invention, the oxynitride thermoelectric material which is the first nitrogen-containing thermoelectric material comprises at least a metal selected from Al, Ga and In, an oxygen atom (O) and a nitrogen atom (N) as essential components, together with a transition element and a rare earth element, if necessary, and has a composition represented by the following formula (A):

  (A)

In formula (A), as M, any transition element can be used, and it is preferably at least one element selected from Fe, Ni, Co and Mn. As R, any rare earth element can be used, examples include Sc, Y, La, Ce, Pr, Nd, Pm, Sm, Eu, Gd, Tb, Dy, Ho, Er, Tm, Yb, Lu and the like, and among these, at least one selected from Gd, Sc, Sm, Tb and Dy is preferred.

In the composition ratio in formula (A), a value x indicating the proportion of In is within a range of $0.2 \leq x \leq 1.0$, preferably $0.3 \leq x \leq 0.8$; a value y indicating the proportion of Ga is within a range of $0 \leq y \leq 0.7$, preferably $0.1 \leq y \leq 0.3$; and a value z indicating the proportion of Al is within a range of $0 \leq z \leq 0.7$, preferably $0 \leq z \leq 0.2$. It is, however, necessary that a requirement of $x+y+z=1$ is satisfied.

Also, a value s indicating the proportion O is within a range of $0.4 \leq s \leq 1.2$, preferably $0.5 \leq s \leq 1.1$, and a value s+t indicating the sum of O and N is within a range of $0.9 \leq s+t \leq 1.7$.

A value u indicating the proportion of the transition element M is within a range of $0 \leq u \leq 0.7$, and a value v indicating the proportion of the rare metal element is within a range of $0 \leq v \leq 0.05$.

In the characteristics of the oxynitride thermoelectric material of the present invention, it is necessary that the Seebeck coefficient at 100° C. is, in an absolute value, 40 μV/K or more (−40 μV/K or less). Also, it preferably has an electrical resistivity of $10^{-3}$ Ωm or less.

Figure 1:
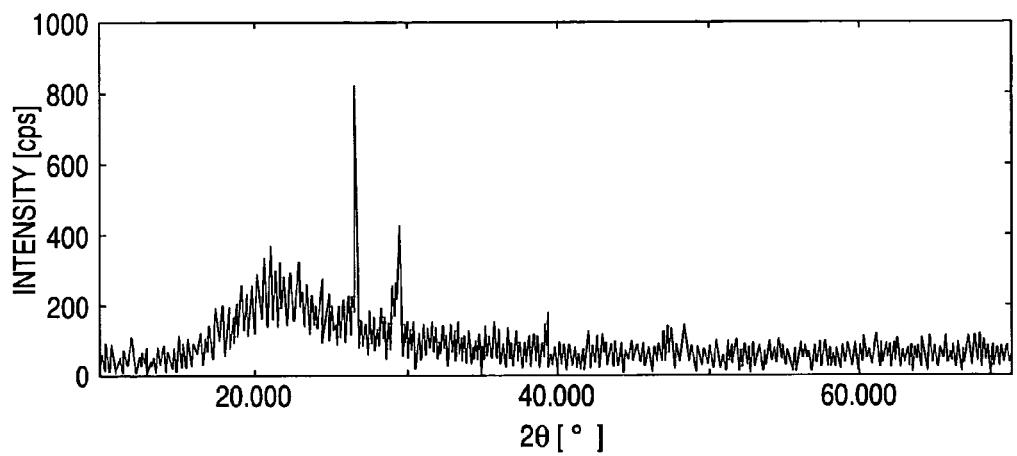
In FIG. 1, (a) is an X-ray diffraction pattern of a quartz glass substrate. (b) is an X-ray diffraction pattern of the oxynitride thermoelectric material obtained in Example 1 on a quartz glass substrate.
Figure 1:
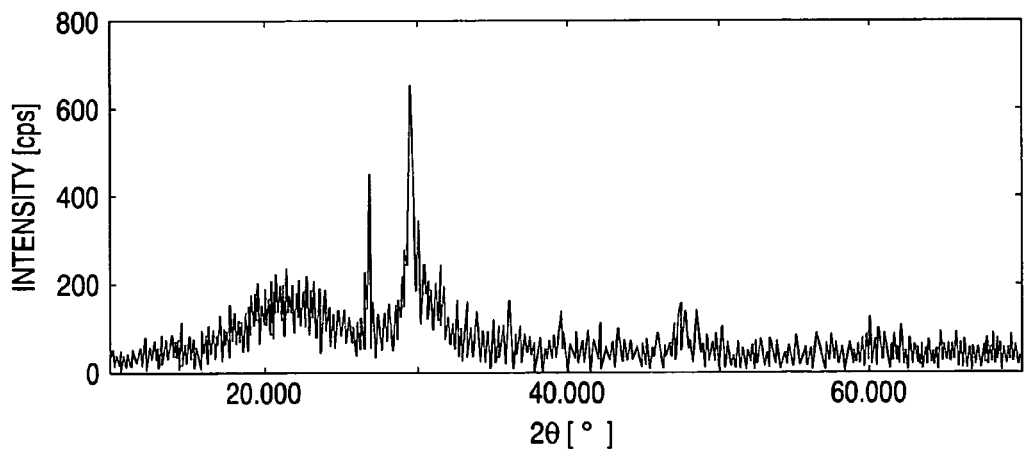

The oxynitride thermoelectric material has an amorphous structure. In order to clarify this point, an X-ray diffraction pattern of an oxynitride thermoelectric material obtained in the following Example 1 is shown in FIG. 1. FIG. 1(a) shows a pattern for a quartz glass substrate, and FIG. 1(b) is a pattern for a thin film of the oxynitride thermoelectric material prepared thereon. In FIG. 1(b), a peak considered to indicate crystallization is not observed, but a broad curve as in the glass substrate is observed, indicating an amorphous structure. The crystallinity is also dependent on a film preparation method, and it is clarified that a sample immediately after preparation with a sputtering method at a relatively low temperature (100° C. or less) assumes an amorphous structure.

Figure 2:
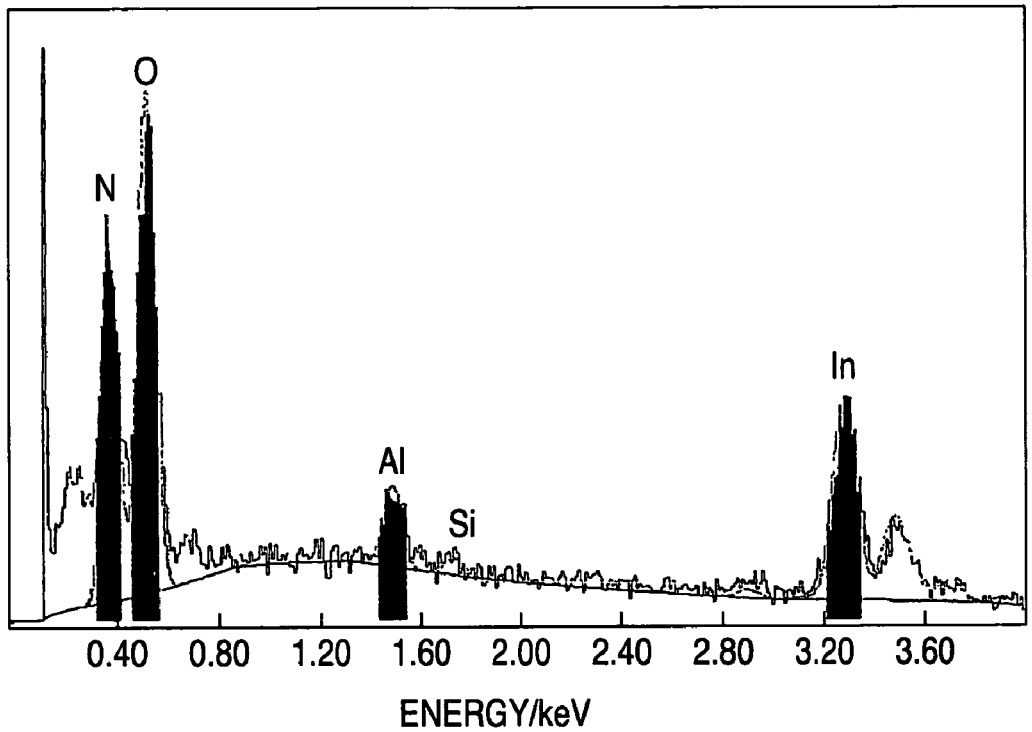
FIG. 2 is an EDX analysis pattern of the oxynitride thermoelectric material obtained in Example 1.

Also, FIG. 2 shows an EDX analysis pattern of an AlInON sample obtained in Example 1 to be explained below. The compositional analysis clarifies that Al, In, and N are principal constituent elements.

The oxynitride thermoelectric material having the above specific composition ratio has a Seebeck coefficient in absolute value of 40 μV/K or more (or −40 μV/K or less) at a temperature of 100° C. or more, and mostly has an electric resistivity of $10^{-3}$ Ωm or less. This oxynitride thermoelectric material shows an N-type electrical conduction and has a negative Seebeck coefficient.

Since the oxynitride thermoelectric material of the present invention has a high Seebeck coefficient and a low electrical resistivity at the same time, it can exhibit a high thermoelectric transformation efficiency.

Additionally, the oxynitride thermoelectric material is excellent in various characteristics such as a heat resistance and a chemical resistance, and is constituted by only elements having low toxicity, thus having a high practical value as an thermoelectric material.

Then, the nitride thermoelectric material which is the second nitrogen-containing thermoelectric material of the present invention has a composition ratio represented by the following formula (B):

  (B)

wherein M represents a transition element; R represents a rare earth element; D represents an element of the Group IV or II; $0 \leq z \leq 0.7$, $0 \leq y \leq 0.7$, $0.2 \leq x \leq 1.0$, $0 \leq u \leq 0.7$, $0 \leq v \leq 0.05$, $0 \leq w \leq 0.2$, and $0.9 \leq m \leq 1.1$; and $x+y+z=1$, and has an absolute value of a Seebeck coefficient of 50 μV/K or more (or −50 μV/K or less) at a temperature of 100° C. or more, and an electrical resistivity of $10^{-3}$ Ωm or less.

In formula (B), M represents a transition metal element, and examples which can be used include at least one element selected from Fe, Ni, Co and Mn. R is a rare earth element, and examples which can be used include at least an element selected from Sc, Y, La, Ce, Pr, Nd, Pm, Sm, Eu, Gd, Tb, Dy, Ho, Er, Tm, Yb, Lu and the like. In the above composition ratio, a value x indicating the proportion of In is within a range of $0.2 \leq x \leq 1.0$, preferably $0.3 \leq x \leq 0.8$; and a value y indicating the proportion of Ga is within a range of $0.1 \leq y \leq 0.7$, preferably $0.2 \leq y \leq 0.8$.

Figure 8:
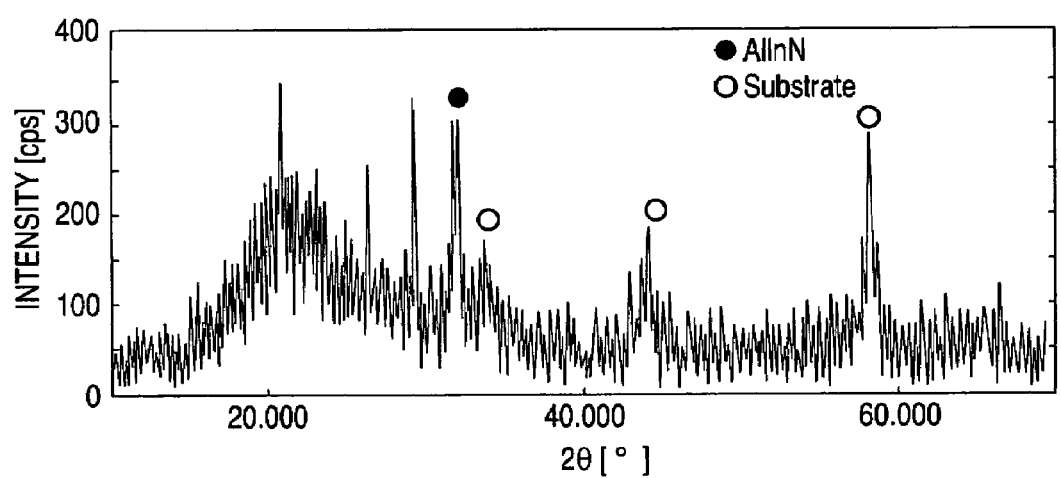
FIG. 8 is the X-ray diffraction pattern of a nitride thermoelectric material obtained in Example 26.

The nitride thermoelectric material of the present invention has a wurtzite structure or an amorphous structure. In order to clarify this point, an X-ray diffraction pattern of a nitride thermoelectric material obtained in the following Example 26 is shown in FIG. 8. In FIG. 8, a diffraction peak around 32° corresponds to a wurtzite crystal structure, and other peaks are diffraction peaks from a substrate. The crystallinity is also dependent on a film preparation method, and it is clarified that a sample immediately after preparation with a sputtering method has an amorphous structure and that a sample after a heat treatment has a wurtzite structure.

Figure 9:
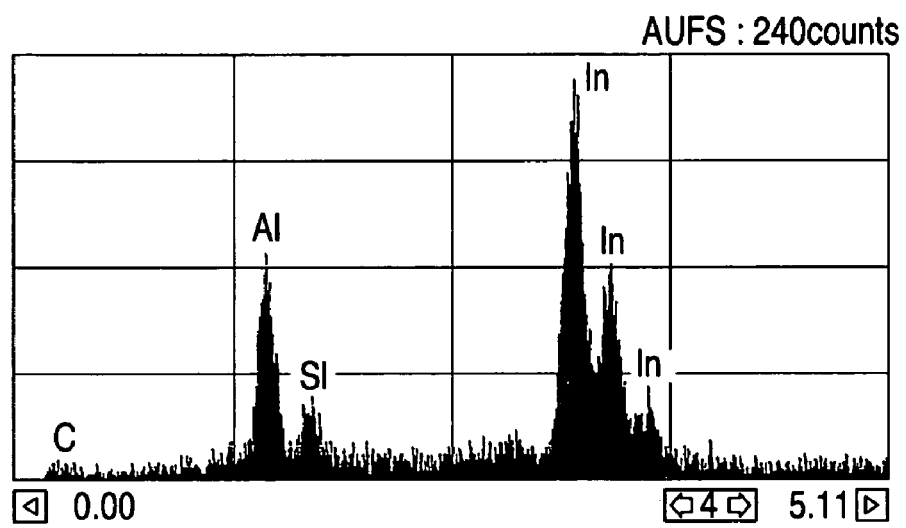
In FIG. 9, (a) is the EDX analysis pattern of an AlInN sample of Example 26, and (b) is an EDX pattern of an AlGaInN sample.
Figure 9:
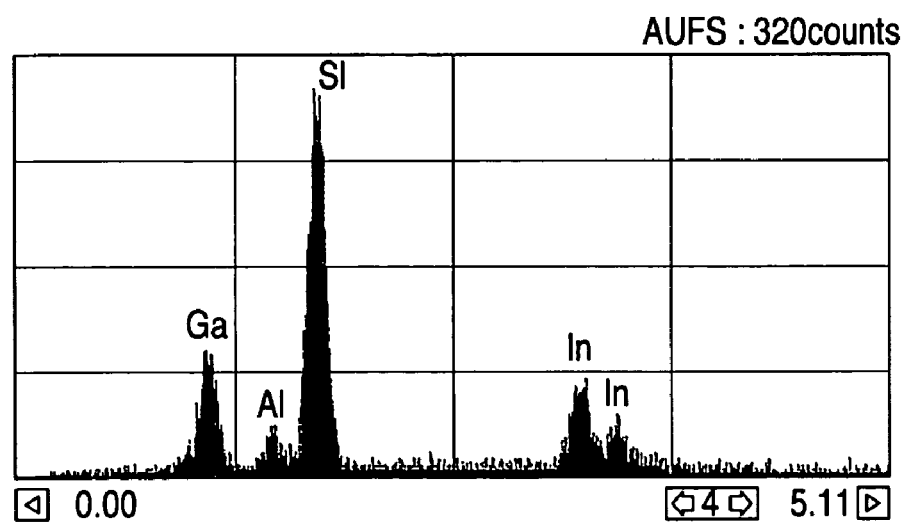

Also, in FIG. 9, (a) shows an EDX analysis pattern of an AlInN sample of Example 1 to be explained below, and (b) shows an EDX pattern of an AlGaInN sample. These compositional analyses clarify that Al, Ga, In etc. are principal constituent elements. Also, a peak corresponding to nitrogen can be determined by using a higher sensitive detector in a similar manner.

The nitride thermoelectric material of the present invention, having the above specific composition ratio, has an absolute value of a Seebeck coefficient of 50 μV/K or more (or −50 μV/K or less) at a temperature of 100° C. or more, and an electrical resistivity of $10^{-3}$ Ωm or less, and shows an N-type electrical conduction and a negative Seebeck coefficient. Since the nitride thermoelectric material has a high Seebeck coefficient and a low electrical resistivity at the same time, it can exhibit a high thermoelectric conversion efficiency.

Additionally, the nitride thermoelectric material is excellent in various characteristics such as a heat resistance and a chemical resistance, and comprises elements having low toxicity, thus having a high practical value as an thermoelectric material.

The thermoelectric material of the present invention can be produced by supplying a raw material substance in a predetermined amount, and I) by executing a sputtering in a mixed gas of argon, nitrogen and oxygen, or II) by supplying a predetermined raw material in a predetermined amount.

In the case of the oxynitride thermoelectric material, the raw material substance is not particularly limited, so long as it can form an oxynitride thermoelectric material with a purpose of formation of a thin film, and a single metal, an oxide, a nitride or the like can be suitably used. For example, the Ga source includes Ga metal, GaN, trimethylgallium (($CH_3)_3$Ga), triethylGa, Ga chloride ($GaCl_2$), $Ga_2N_3$ and the like, and the rare earth source includes an oxide (e.g., gadolinium oxide ($Gd_2O_3$)), a nitride (e.g., gadolinium nitride (GdN)), trimethyl Gd and the like. Also, a compound containing two or more of the constituent elements of the oxynitride thermoelectric material can be utilized as a raw material.

In the case of the nitride thermoelectric material, the raw material substance is not particularly limited, so long as it can form a nitride thermoelectric material with a purpose of formation of a thin film, and a single metal, a nitride or the like can be used. For example, the Ga source includes Ga metal, GaN, trimethylgallium (($CH_3)_3$Ga), triethylGa, Ga chloride ($GaCl_2$), and the like, and the rare earth source includes a nitride such as gadolinium nitride (GdN) or trimethylgadolinium. Also, a compound containing two or more of the constituent elements of the nitride thermoelectric material can be utilized as a raw material.

Film preparation means in the present invention is not particularly limited, and a known thin film forming method such as a sputtering method, a metal organic chemical vapor deposition method or a molecular beam epitaxy method can be utilized. A film forming time and a temperature may be any conditions capable of forming a thin film of a nitrogen-containing thermoelectric material, and are not particularly limited, but it is preferable to form a film for example at about 50 to 1100° C. for about 30 minutes to 3 hours. Also, amounts of oxygen and nitrogen in the generated thermoelectric material can be suitably controlled by a nitrogen gas partial pressure, a film growth temperature and the like at the film preparation.

Also, since the formation of a thin film is not essential for exhibiting the characteristics, a form of a sample it not limited to a thin film, and a bulk member prepared, for example, by a method of weighing a predetermined amount of a raw material powder such as GaN, AlN, InN, $Ga_2O_3$, $Al_2O_3$, $In_2O_3$, or a single metal element, followed by alloying and sintering at a high temperature, is also effective as an thermoelectric material.

Figure 3:
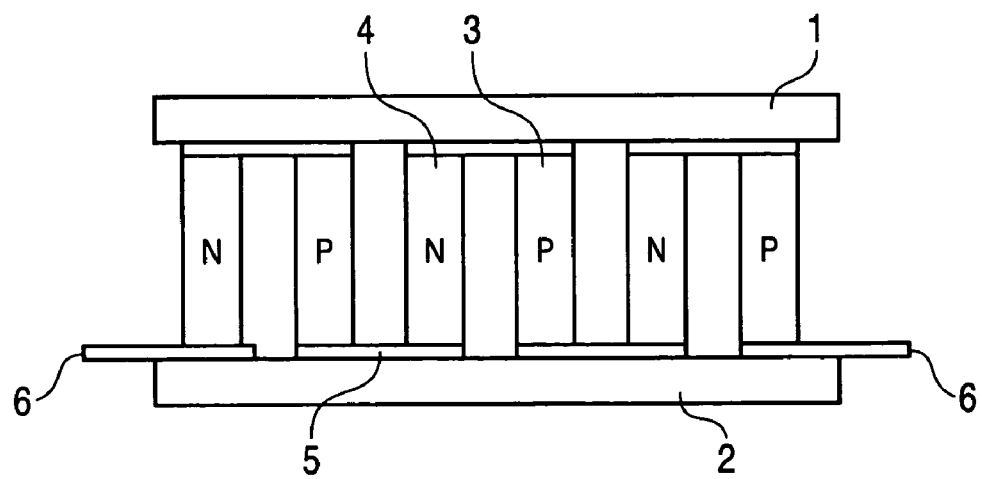
FIG. 3 is a schematic view of an example of an thermoelectric transformation element utilizing a nitrogen-containing oxynitride thermoelectric material of the present invention as an thermoelectric material.

An example of an thermoelectric element, employing the nitrogen-containing thermoelectric material of the present invention as an thermoelectric material, is schematically shown in FIG. 3. The thermoelectric element has a structure similar to that of a known thermoelectric element, and, in an thermoelectric element constituted, for example, of a substrate for high temperature 1, a substrate for low temperature 2, a P-type thermoelectric material 3, an N-type thermoelectric material 4, an electrode 5, wirings 6 and the like, the oxynitride thermoelectric material or the nitride thermoelectric material of the present invention may be utilized as the N-type thermoelectric element.

EXAMPLES

The present invention is described below in detail based on Examples, but the present invention is not limited to these Examples.

Example 1

Metallic Al as an Al source and metallic In as an In source were used, and an In metal sheet of a cover rate of 20% was placed on an Al target of a diameter of 130 mm and $Al_xIn_x$-$O_sN_t$ was prepared by an RF sputtering method with a mixed gas of argon/nitrogen gas/oxygen gas (Ar:N:O=5:5:0.1). The deposition time was 3 hours and the film forming temperature was 80° C. The obtained oxynitride thermoelectric material had a composition of $Al_{0.30}In_{0.70}O_{0.40}N_{0.60}$.

Figure 4:
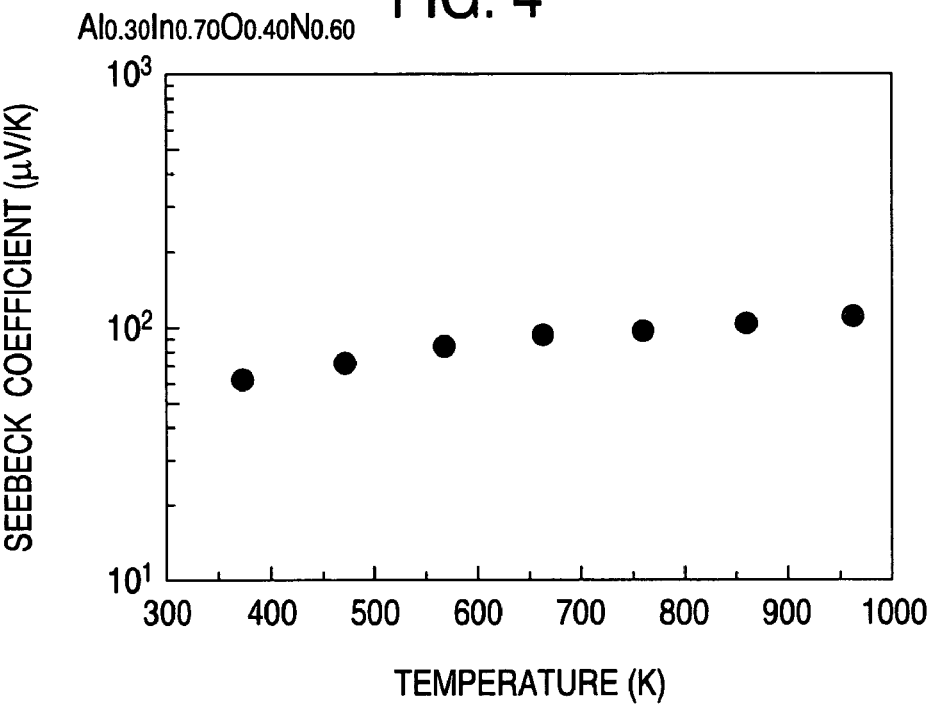
FIG. 4 is a graph showing a temperature dependence of a Seebeck coefficient of the oxynitride thermoelectric material obtained in Example 1 at 100 to 700° C.

A graph showing a temperature dependence of the Seebeck coefficient of the obtained oxynitride thermoelectric material at 100 to 700° C. is shown in FIG. 4. From FIG. 4, it was found that this oxynitride thermoelectric material had a Seebeck coefficient of 40 μV/K or more in absolute value within a temperature range of 100 to 700° C.

Figure 5:
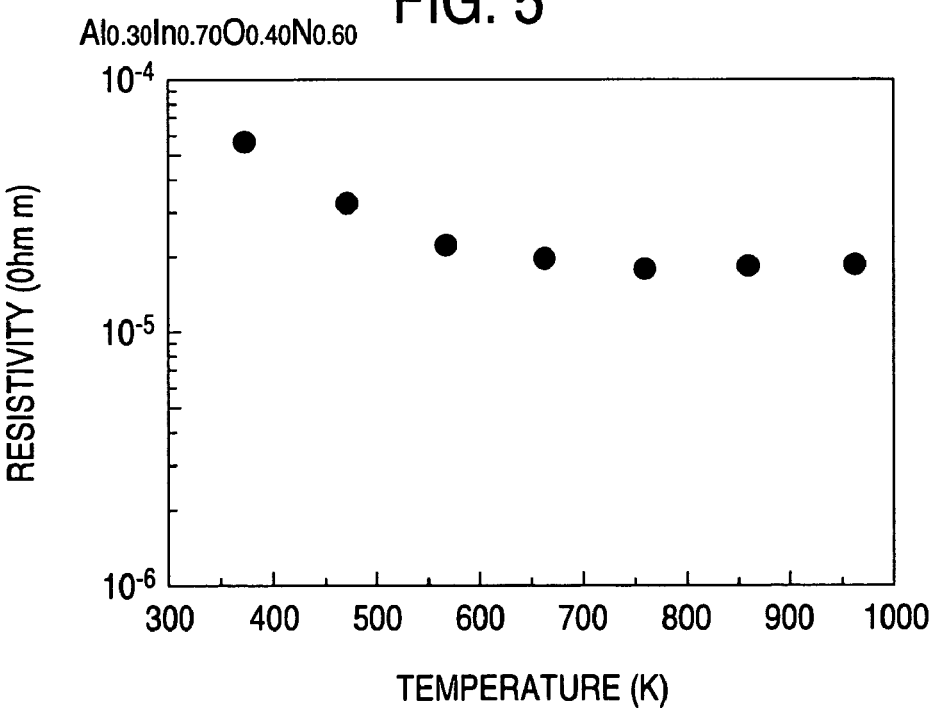
FIG. 5 is a graph showing a temperature dependence of an electrical resistivity of the oxynitride thermoelectric material obtained in Example 1, measured by a DC four-terminal method.

Also, a graph showing a temperature dependence, on this oxynitride thermoelectric material, of electrical resistivity measured by a DC four-terminal method is shown in FIG. 5. Based on FIG. 5, the electrical resistivity of the oxynitride thermoelectric material showed a semiconductor-like behavior of a decrease with an increase in temperature, and was as low as $10^{-4}$ Ωm or less at 700° C.

Example 2

In the following, there will be shown a case where a number of constituent elements is increased. Ga was further added to the composition of Example 1, and an oxynitride thermoelectric material represented by formula $Al_{0.23}In_{0.70}Ga_{0.70}O_{0.40}N_{0.60}$ was prepared in a similar manner as in Example 1.

Figure 6:
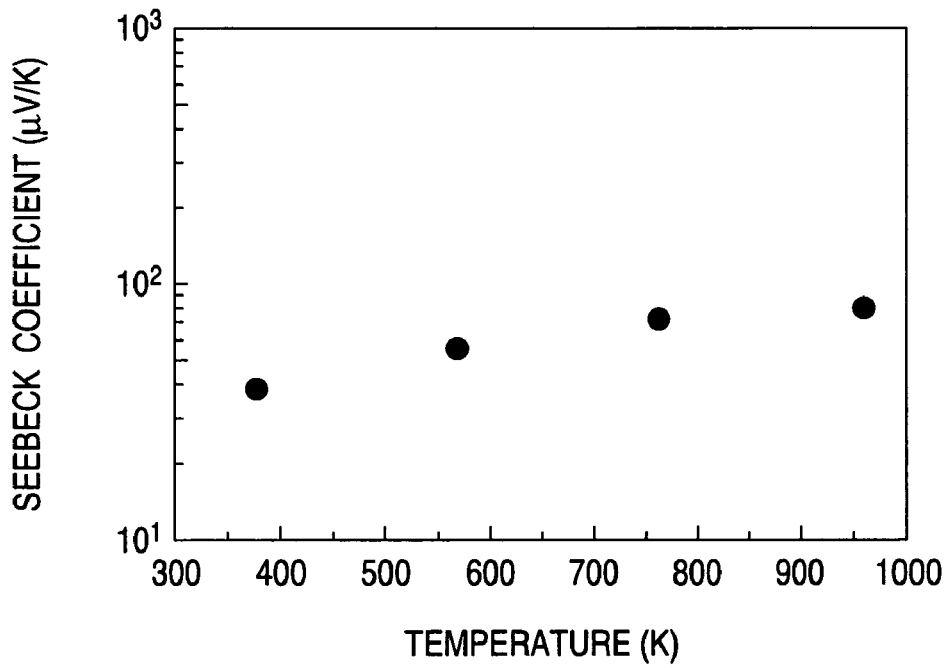
FIG. 6 is a graph showing a temperature dependence of a Seebeck coefficient of the nitride thermoelectric material obtained in Example 2 at 100 to 700° C.

A graph showing a temperature dependence of the Seebeck coefficient of the obtained oxynitride thermoelectric material at 100 to 700° C. is shown in FIG. 6. From FIG. 6, it was found that this oxynitride thermoelectric material had a Seebeck coefficient of 50 NV/K or more in absolute value within a temperature range of 100 to 700° C.

Figure 7:
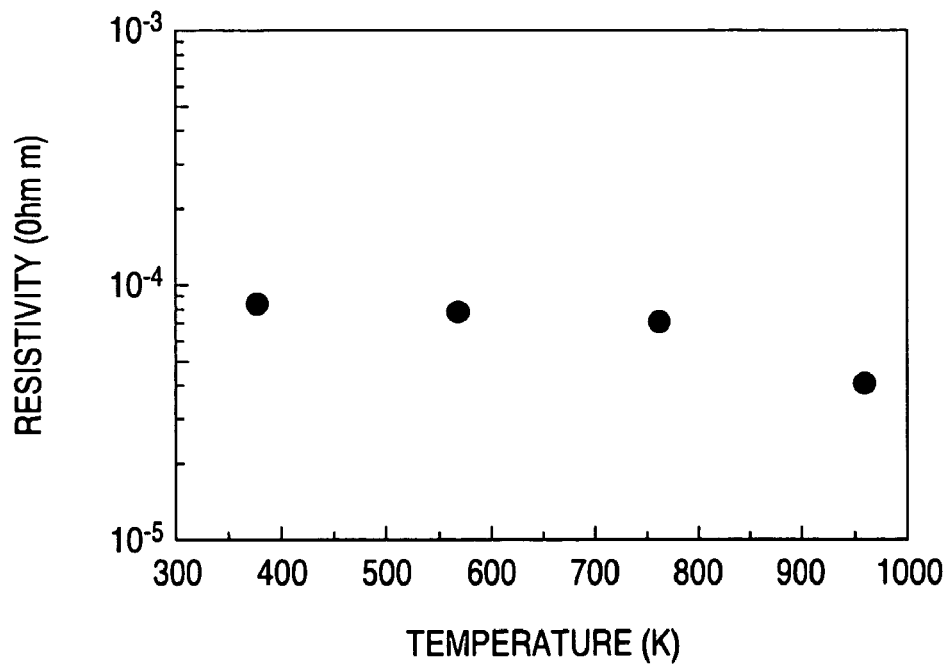
FIG. 7 is a graph showing a temperature dependence of an electrical resistivity of the nitride thermoelectric material obtained in Example 2, measured by a DC four-terminal method.

Also, a graph showing a temperature dependence, on this oxynitride thermoelectric material, of electrical resistivity measured by a DC four-terminal method is shown in FIG. 7. Based on FIG. 7, the electrical resistivity of the oxynitride thermoelectric material showed a semiconductor-like behavior of a decrease with an increase in temperature, and was as low as $10^{-4}$ Ωm or less at 700° C.

An increase in the number of the constituent elements of the thermoelectric material of this type is expected to influence not only electrical characteristics but also a thermal conductivity. More specifically, in an analogy to a fact that, in comparison with a single element semiconductor such as Si or Ge, a mixed crystal composition of Si and Ge, for example $Si_{0.5}Ge_{0.5}$ shows a thermal conductivity of about 1/20, a complication of the mixed crystal composition also in the present oxynitride thermoelectric material is considered to reduce the thermal conductivity and to provide an improvement in the performance. More specifically, in the case where a complication of the mixed crystal does not change the electrical performance significantly as in Example 2, the figure of merit is considered to be further improved.

Examples 3-6

Oxynitride thermoelectric materials represented by formula $Al_{0.20}Ga_{0.15}In_{0.65}M_{0.20}O_{0.45}N_{0.55}$ were prepared in the same manner as in Example 1, except that the transition element compound used as the raw material was changed to compounds shown in Table 1. In the formula, M includes at least one of transition metals (Ni, Fe, Co and Mn).

Results of measurement of the Seebeck coefficient and the electrical resistivity of the obtained oxynitride thermoelectric materials are shown in Table 1.

TABLE 1

Formula: $Al_{0.20}Ga_{0.15}In_{0.65}M_{0.20}O_{0.45}N_{0.55}$

| Ex. No. | Transition metal M Kind and raw material | Seebeck coefficient (μV/K) | Electrical resistivity ($10^{-4}$ Ωm) | Measured temperature (° C.) |
|---|---|---|---|---|
| 3 | Ni | 110 | 3.2 | 600 |
| 4 | Fe | 80 | 4.1 | 600 |
| 5 | Co | 70 | 4.2 | 600 |
| 6 | Mn | 69 | 2.5 | 600 |

Examples 7-22

Oxynitride thermoelectric materials represented by formula $Al_{0.20}Ga_{0.19}In_{0.61}R_{0.20}O_{0.42}N_{0.60}$ were prepared in the same manner as in Example 1, except that the rare earth element used as the raw material was changed to elements shown in Table 2. As R, a rare earth element selected from Sc, Y, La, Ce, Pr, Nd, Pm, Sm, Eu, Gd, Tb, Dy, Ho, Er, Tm, Yb and Lu was used.

Results of measurement of the Seebeck coefficient and the electrical resistivity of the obtained oxynitride thermoelectric materials are shown in Table 2.

TABLE 2

Formula: $Al_{0.20}Ga_{0.19}In_{0.61}R_{0.20}O_{0.42}N_{0.60}$

| Ex. No. | Transition metal M Kind and raw material | Seebeck coefficient (μV/K) | Electrical resistivity ($10^{-4}$ Ωm) | Measured temperature (° C.) |
|---|---|---|---|---|
| 7 | Gd | 120 | 1.2 | 700 |
| 8 | Sc | 85 | 2.2 | 600 |
| 9 | Y | 84 | 21 | 600 |

TABLE 2-continued

Formula: $Al_{0.20}Ga_{0.19}In_{0.61}R_{0.20}O_{0.42}N_{0.60}$

| Ex. No. | Transition metal M Kind and raw material | Seebeck coefficient (μV/K) | Electrical resistivity ($10^{-4}$ Ωm) | Measured temperature (° C.) |
|---|---|---|---|---|
| 10 | La | 80 | 45 | 500 |
| 11 | Ce | 75 | 80 | 500 |
| 12 | Pr | 77 | 59 | 500 |
| 13 | Nd | 53 | 91 | 500 |
| 14 | Sm | 91 | 3.1 | 700 |
| 15 | Eu | 65 | 19 | 500 |
| 16 | Tb | 103 | 1.1 | 700 |
| 17 | Dy | 104 | 1.9 | 700 |
| 18 | Ho | 71 | 17 | 500 |
| 19 | Er | 66 | 29 | 500 |
| 20 | Tm | 70 | 80 | 600 |
| 21 | Yb | 70 | 39 | 500 |
| 22 | Lu | 66 | 30 | 500 |

Samples of these Examples to which these rare earth elements were added had an N-type conductivity. Among these, samples utilizing Gd, Sc, Sm and Tb had a low resistivity and a high Seebeck coefficient at the same time, and can be utilized as an thermoelectric material.

Also, in these rare earth element-added compositions, for similar reasons as in Example 2, an effect of mixed crystal formation is expected to provide a reduction in the thermal conductivity, thereby providing an improvement in the figure of merit.

Examples 23-25 and Comparative Example 1

Oxynitride thermoelectric materials represented by formula $Al_{0.18}Ga_{0.17}In_{0.65}O_sN_t$ were prepared in the same manner as in Example 1. Results of measurement of the Seebeck coefficient and the electrical resistivity of the obtained oxynitride thermoelectric materials are shown in Table 3.

TABLE 3

Formula: $Al_{0.18}Ga_{0.17}In_{0.65}O_xN_t$

| Ex. No. | Composition ratio x, z | Seebeck coefficient (μV/K) | Electrical resistivity ($10^{-4}$ Ωm) | Measured temperature (° C.) |
|---|---|---|---|---|
| 23 | s = 0.10, t = 0.90 | 89 | 0.62 | 700 |
| 24 | s = 0.21, t = 0.80 | 101 | 0.71 | 700 |
| 25 | s = 0.40, t = 0.55 | 116 | 1.52 | 700 |
| Comp. Ex. 1 | s = 0.80, t = 0.21 | unmeasurable | 10 Ωm | |

In a comparison of Examples 23, 24 and 25, an increase in the composition ratio of the oxygen atom (O) tends to increase the Seebeck coefficient and the resistivity.

This fact suggests that an increase in O decreases an electron concentration. Since the N-type conduction is considered to result from a defect generated by the introduction of and N, a material having optimum characteristics can be obtained by adjusting the composition s of O.

Also, in order to show the efficacy of the oxynitride thermoelectric material of the present invention, a sample having a composition outside the range defined in the present invention was prepared and results of similar evaluations are shown as Comparative Example 1 in Table 3. The Comparative Example 1 had a composition of oxygen atom (O) of s=0.8, and, in such case, resistance was about 10 Ωm and Seebeck coefficient was unmeasurable because of noises.

Example 26

Metallic Al as an Al source and metallic In as an In source were used, and an In metal sheet of a cover rate of 5% was placed on an Al target of a diameter of 130 mm and AlInN was prepared by an RF sputtering method with argon:nitrogen gas=1:1. The film forming time was 3 hours and the film forming temperature was 80° C. The obtained nitride thermoelectric material is represented by an element composition of $Al_{0.50}In_{0.50}N$.

Figure 10:
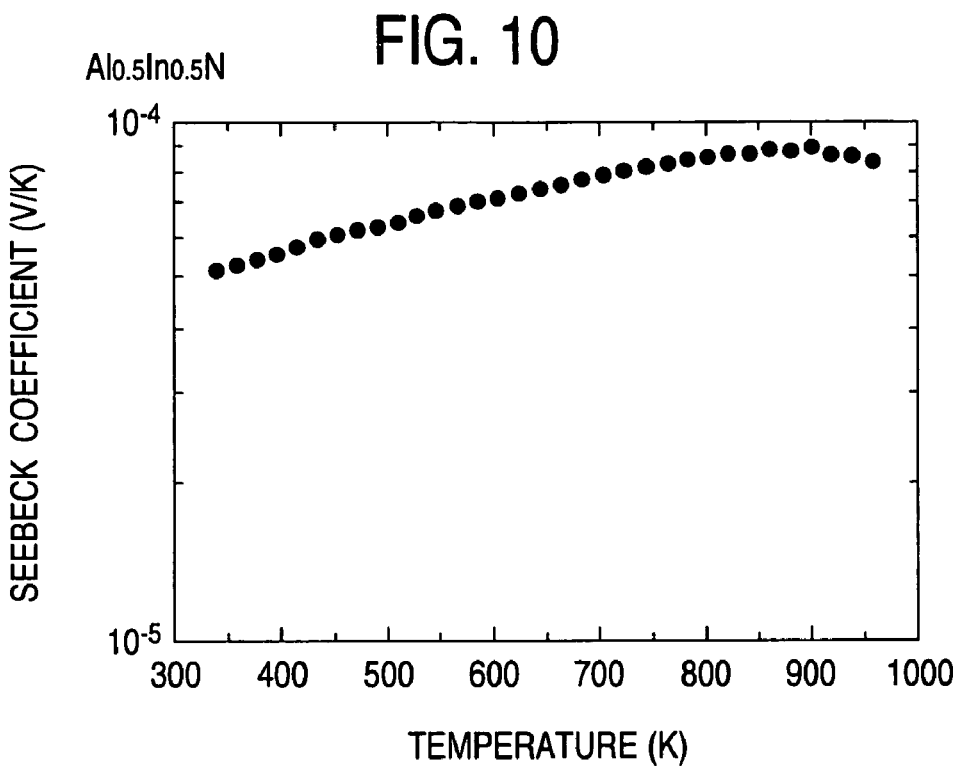
FIG. 10 is a graph showing a temperature dependence of a Seebeck coefficient of the nitride thermoelectric material obtained in Example 26 at 100 to 700° C.

A graph showing a temperature dependence of the Seebeck coefficient of the obtained nitride thermoelectric material at 100 to 700° C. is shown in FIG. 10. From FIG. 10, it was found that this nitride thermoelectric material had a Seebeck coefficient of 50 μV/K or more in absolute value within a temperature range of 100 to 700° C.

Figure 11:
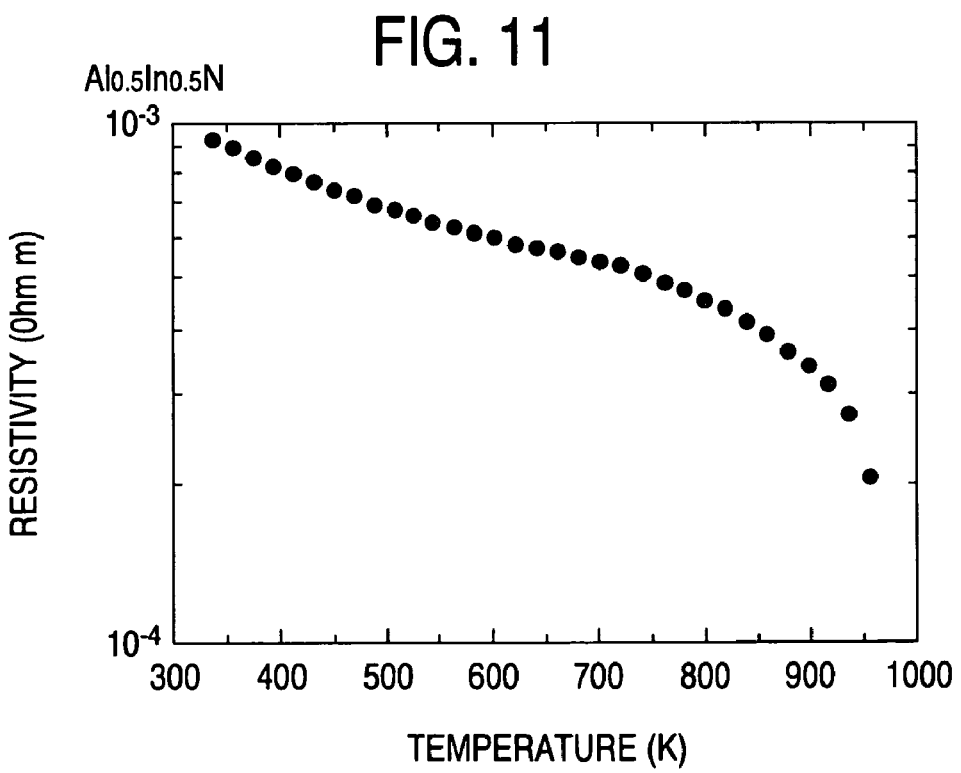
FIG. 11 is a graph showing a temperature dependence of an electrical resistivity of the nitride thermoelectric material obtained in Example 26, measured by a DC four-terminal method.

Also, a graph showing a temperature dependence, on this nitride thermoelectric material, of electrical resistivity measured by a DC four-terminal method is shown in FIG. 11. Based on FIG. 11, the electrical resistivity of the nitride thermoelectric material showed a semiconductor-like behavior of a decrease with an increase in temperature, and was as low as $10^4$ Ωm at 700° C.

Example 27

In the following, there will be shown a case where a number of constituent elements is increased. Ga was further added to the composition of Example 26, and a nitride thermoelectric material represented by formula $Al_{0.26}Ga_{0.44}In_{0.30}N_{1.0}$ was prepared in a similar manner as in Example 26.

Figure 12:
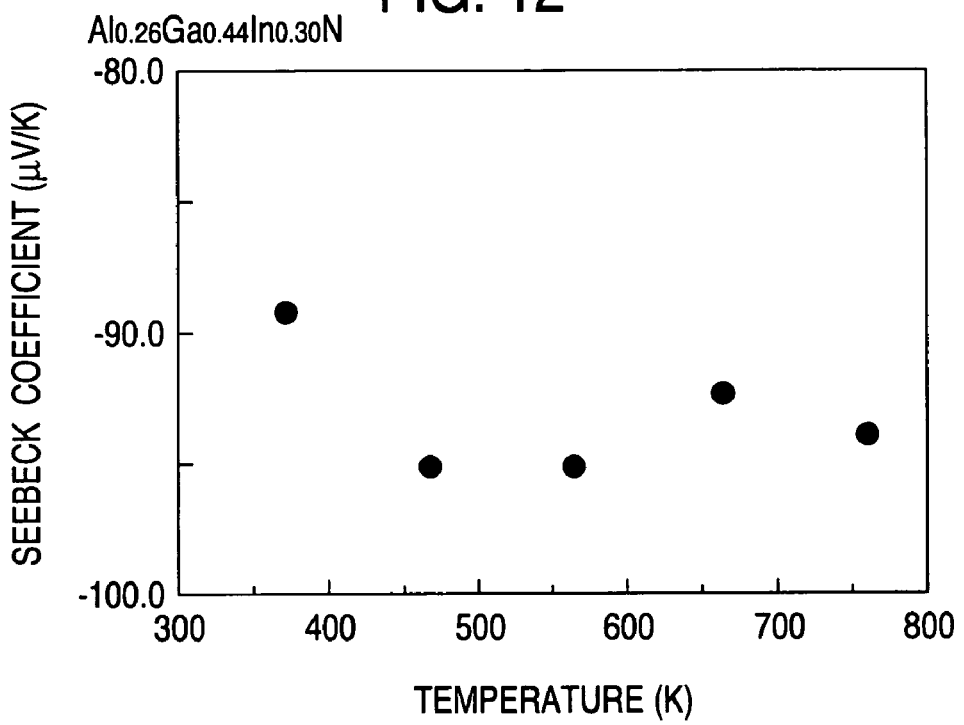
FIG. 12 is a graph showing a temperature dependence of a Seebeck coefficient of the nitride thermoelectric material obtained in Example 27 at 100 to 700° C.

A graph showing a temperature dependence of the Seebeck coefficient of the obtained nitride thermoelectric material at 100 to 700° C. is shown in FIG. 12. From FIG. 12, it was found that this nitride thermoelectric material had a Seebeck coefficient of 50 μV/K or more in absolute value within a temperature range of 100 to 700° C.

Figure 13:
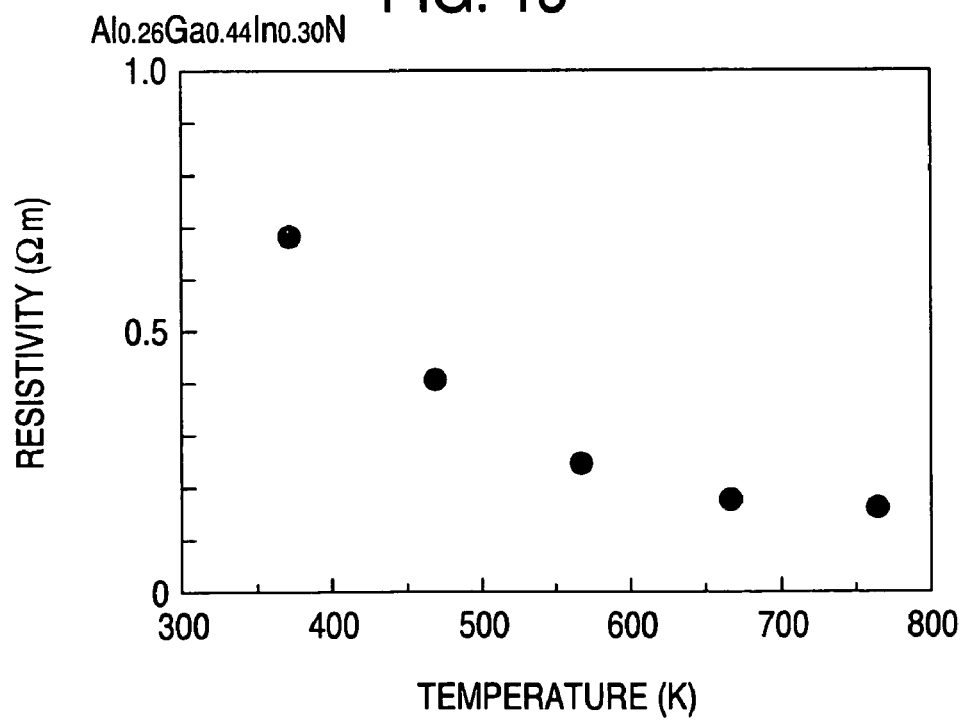
FIG. 13 is a graph showing a temperature dependence of the electrical resistivity of the nitride thermoelectric material obtained in Example 27, measured by a DC four-terminal method.

Also, a graph showing a temperature dependence, on this nitride thermoelectric material, of electrical resistivity measured by a DC four-terminal method is shown in FIG. 13. Based on FIG. 13, the electrical resistivity of the nitride thermoelectric material showed a semiconductor-like behavior of a decrease with an increase in temperature, and was as low as $10^{-4}$ Ωm at 700° C., as in Example 26.

An increase in the number of the constituent elements is expected to influence not only electrical characteristics but also a thermal conductivity. More specifically, in an analogy to a fact that, in comparison with a single element semiconductor such as Si or Ge, a mixed crystal composition of Si and Ge, for example, $Si_{0.5}Ge_{0.5}$ shows a thermal conductivity of about 1/20, a complication of the mixed crystal composition also in the present nitride thermoelectric material is considered to reduce the thermal conductivity and to provide an improvement in the performance. More specifically, in case a complication of the mixed crystal does not change the electrical performance significantly as in Example 27, the figure of merit is considered to be further improved.

Examples 28-31

Nitride thermoelectric materials represented by formula $Al_{0.29}Ga_{0.01}In_{0.70}M_{0.20}N_{1.0}$ were prepared in the same manner as in Example 26, except that the transition element compound used as the raw material was changed to compounds shown in Table 4. In the formula, M includes at least one of transition metals (Ni, Fe, Co and Mn).

Results of measurement of the Seebeck coefficient and the electrical resistivity of each of the obtained nitride thermoelectric materials are shown in Table 4.

TABLE 4

Formula: $Al_{0.29}Ga_{0.01}In_{0.70}M_{0.20}N_{1.0}$

| Ex. No. | Transition metal M Kind and raw material | Seebeck coefficient (μV/K) | Electrical resistivity ($10^{-4}$ Ωm) | Measured temperature (° C.) |
|---|---|---|---|---|
| 28 | Ni | −100 | 5.1 | 600 |
| 29 | Fe | −70 | 5.5 | 600 |
| 30 | Co | −75 | 6 | 600 |
| 31 | Mn | −80 | 4.5 | 600 |

Examples 32-47

Nitride thermoelectric materials represented by formula $Al_{0.29}Ga_{0.01}In_{0.70}R_{0.05}N_{1.0}$ were prepared in the same manner as in Example 26, except that the rare earth element used as the raw material was changed to elements shown in Table 5. In the formula, R is a rare earth element, more specifically at least one element selected from Sc, Y, La, Ce, Pr, Nd, Pm, Sm, Eu, Gd, Tb, Dy, Ho, Er, Tm, Yb and Lu.

Results of measurement of the Seebeck coefficient and the electrical resistivity of the obtained nitride thermoelectric materials are shown in Table 5.

TABLE 5

Formula: $Al_{0.29}Ga_{0.01}In_{0.70}R_{0.05}N_{1.0}$

| Ex. No. | Transition metal R Kind and raw material | Seebeck coefficient (μV/K) | Electrical resistivity ($10^{-4}$ Ωm) | Measured temperature (° C.) |
|---|---|---|---|---|
| 32 | Gd | −110 | 2.0 | 700 |
| 33 | Sc | −80 | 3.5 | 600 |
| 34 | Y | −83 | 31 | 600 |
| 35 | La | −81 | 50 | 500 |
| 36 | Ce | −74 | 84 | 500 |
| 37 | Pr | −69 | 65 | 500 |
| 38 | Nd | −51 | 87 | 500 |
| 39 | Sm | −88 | 2.5 | 700 |
| 40 | Eu | −42 | 35 | 500 |
| 41 | Tb | −101 | 1.6 | 700 |
| 42 | Dy | −98 | 3.4 | 700 |
| 43 | Ho | −64 | 14 | 500 |
| 44 | Er | −46 | 36 | 500 |
| 45 | Tm | −67 | 85 | 600 |
| 46 | Yb | −66 | 45 | 500 |
| 47 | Lu | −56 | 43 | 500 |

All the samples of these Examples to which the rare earth elements were added had an N-type conductivity. Among these, samples with Gd, Sc, Sm and Tb, satisfied a low resistivity and a high Seebeck coefficient at the same time, and can be utilized as an thermoelectric material. Also, in the rare earth element-added compositions, for similar reasons as in Example 27, an effect of mixed crystal formation is expected to provide a reduction in the thermal conductivity, thereby providing an improvement in the figure of merit.

Examples 48-51

Nitride thermoelectric materials represented by formula $Al_{0.29}Ga_{0.01}In_{0.70}D_{0.01}N_{1.0}$ were prepared in the same manner as in Example 26, except that the element of the Group IV or II used as the raw material was replaced by an element shown in Table 6. In the formula, D contains at least one of an element of the Group IV (Ge, Si) or an element of the Group II (Zn, Mg).

Results of measurement of the Seebeck coefficient and the electrical resistivity of the obtained nitride thermoelectric materials are shown in Table 6.

TABLE 6

Formula: $Al_{0.29}Ga_{0.01}In_{0.70}D_{0.01}N_{1.0}$

| Ex. No. | Element D Kind and raw material | Seebeck coefficient ($\mu V/K$) | Electrical resistivity ($10^{-4}\ \Omega m$) | Measured temperature (° C.) |
|---|---|---|---|---|
| 48 | Ge | −96 | 31 | 600 |
| 49 | Si | −85 | 56 | 600 |
| 50 | Mg | −47 | 96 | 600 |
| 51 | Zn | −51 | 85 | 600 |

Examples 52-54 and Comparative Example 2

Nitride thermoelectric materials represented by formula $Al_zGa_{0.01}In_xN_{1.0}$ were prepared.

Results of measurement of the Seebeck coefficient and the electrical resistivity of the obtained oxynitride thermoelectric materials are shown in Table 7.

TABLE 7

Formula: $Al_zGa_{0.01}In_xN_{1.0}$

| Ex. No. | Composition ratio x, z | Seebeck coefficient ($\mu V/K$) | Electrical resistivity ($10^{-4}\ \Omega m$) | Measured temperature (° C.) |
|---|---|---|---|---|
| 52 | x = 0.4, z = 0.59 | −121 | 51 | 700 |
| 53 | x = 0.5, z = 0.49 | −96 | 10 | 700 |
| 54 | x = 0.7, z = 0.29 | −88 | 3.5 | 700 |
| Comp. Ex. 2 | x = 0, z = 0.99 | N.A. | 1000 | 700 |

In a comparison of Examples 52, 53 and 54, an increase in the composition ratio of In tends to decrease the Seebeck coefficient and the resistivity. This fact suggests that an increase in In increases an electron concentration. Since the N-type conduction is considered to result from a defect generated by the introduction of In, a material having optimum characteristics can be obtained by regulating the composition x of In allows to obtain.

Also, in order to show the efficacy of the nitride thermoelectric material of the present invention, a sample having a composition outside the range defined in the present invention was prepared and results of similar evaluations are shown as Comparative Example 2. Comparative Example 2 had a composition of 1n of x=0, and, in this case, the resistance was about 0.1 Ωm and the Seebeck coefficient was unmeasurable because of noises. The sample of Comparative Example 2 had a resistivity larger by one digit or more than those of Examples 52 to 54, and was identified unsuitable for application as an thermoelectric material.

INDUSTRIAL APPLICABILITY

The nitrogen-containing thermoelectric material of the present invention, though being constituted solely of low-toxicity elements, has a high Seebeck coefficient and a low electrical resistivity, and is excellent in heat resistance and chemical stability. For these reasons, it can easily applied and processed as an thermoelectric material, and is extremely useful as an thermoelectric material utilizing a high-temperature heat source, which cannot be utilized in a prior intermetallic compound material.

It is rendered possible to achieve an effective utilization of thermal energy which has been discarded in the air, by a method, for example, of incorporating the nitrogen-containing thermoelectric material of the present invention into an thermoelectric transformation system.

The invention claimed is:

1. An oxynitride thermoelectric material, which has an element composition represented by the following formula (A):

$$Al_zGa_yIn_xM_uR_vO_sN_t \qquad (A)$$

wherein M represents a transition element; R represents a rare earth element; $0 \leq z \leq 0.7$, $0.1 \leq y \leq 0.3$, $0.2 \leq x \leq 0.9$, $0 \leq u \leq 0.7$, $0 \leq v \leq 0.05$, $0.9 \leq s+t \leq 1.7$ so that the element composition is an oxynitride, and $0.4 \leq s \leq 1.2$; and x+y+z=1, and has an absolute value of a Seebeck coefficient of 40 μV/K or more at a temperature of 100° C. or more.

2. The oxynitride thermoelectric material according to claim 1, wherein the element composition has an electrical resistivity of $10^{-3}$ Ωm or less.

3. The oxynitride thermoelectric material according to claim 1, wherein M in formula (A) is at least one transition element selected from Ni, Fe, Co and Mn.

4. The oxynitride thermoelectric material according to claim 1, wherein R in formula (A) is at least one rare earth element selected from Gd, Sc, Sm, Tb and Dy.

5. The oxynitride thermoelectric material according to claim 1, which comprises at least one said element composition having an amorphous structure.

6. The oxynitride thermoelectric material according to claim 1, wherein $0.3 \leq x \leq 0.8$.

* * * * *